(12) United States Patent
Kawamura

(10) Patent No.: US 10,075,249 B2
(45) Date of Patent: Sep. 11, 2018

(54) MASSIVE-MIMO ANTENNA MEASUREMENT DEVICE AND METHOD OF MEASURING DIRECTIVITY THEREOF

(71) Applicant: ANRITSU CORPORATION, Kanagawa (JP)

(72) Inventor: Takashi Kawamura, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 122 days.

(21) Appl. No.: 15/416,300

(22) Filed: Jan. 26, 2017

(65) Prior Publication Data
US 2017/0222735 A1    Aug. 3, 2017

(30) Foreign Application Priority Data

Jan. 29, 2016    (JP) .................................. 2016-016266

(51) Int. Cl.

| | |
|---|---|
| G01R 29/10 | (2006.01) |
| H04B 17/10 | (2015.01) |
| G01R 29/08 | (2006.01) |
| H01Q 1/24 | (2006.01) |
| H01Q 21/00 | (2006.01) |
| H04B 17/00 | (2015.01) |
| H04B 17/12 | (2015.01) |
| H04B 17/373 | (2015.01) |

(52) U.S. Cl.
CPC ....... *H04B 17/102* (2015.01); *G01R 29/0871* (2013.01); *G01R 29/10* (2013.01); *H01Q 1/246* (2013.01); *H01Q 21/00* (2013.01); *H04B 17/0085* (2013.01); *H04B 17/12* (2015.01); *H04B 17/373* (2015.01)

(58) Field of Classification Search
CPC .. H01B 17/101–17/12; H01B 17/0085; H04Q 1/246; G01R 29/0871; G01R 29/10
USPC ......................................................... 343/703
See application file for complete search history.

(56) References Cited

U.S. PATENT DOCUMENTS

| | | | | |
|---|---|---|---|---|
| 5,432,523 | A * | 7/1995 | Simmers ................ | G01R 29/10 342/360 |
| 6,191,744 | B1 * | 2/2001 | Snow ..................... | G01R 29/10 342/360 |
| 8,471,774 | B2 * | 6/2013 | Oh ......................... | G01R 29/10 342/360 |

OTHER PUBLICATIONS

Ohmsha, Ltd, Antenna Engineering Handbook (2nd Edition), Jul. 25, 2008, p. 730-733.

* cited by examiner

*Primary Examiner* — Dameon E Levi
*Assistant Examiner* — Hasan Islam
(74) *Attorney, Agent, or Firm* — Pearne & Gordon LLP

(57) ABSTRACT

To minimize a measurement range when a near field measurement is performed on the directivity of a massive-MIMO antenna, and prevent the accuracy of measurement from deteriorating. Beam direction detection means 33 causes a probe antenna 12 to perform a rough scanning in a state where an electromagnetic wave radiation plane 1a of a test antenna 1 is directed toward a reference direction directly facing a measurement plane P, and detects the direction of a beam radiated by the test antenna 1 on the basis of a received signal thereof. Antenna direction change means 34 changes the direction of the test antenna 1 so that the detected direction of a beam is directed toward the center of the measurement plane P.

20 Claims, 12 Drawing Sheets

| | AUT1 | AUT2 |
|---|---|---|
| Frequency (GHz) | 24 | 60 |
| Wavelength (mm) | 12.5 | 5 |
| Aperture dimensions D (mm) | 57 × 57 | 23 × 23 |
| Interval between antenna elements ($\lambda$) | 0.5 | 0.5 |
| Number of antenna elements | 8 × 8 | 8 × 8 |
| Gain (dBi) | 24.2 | 24.2 |
| Half power width (deg) | 12.6 | 12.5 |

US 10,075,249 B2

MASSIVE-MIMO ANTENNA MEASUREMENT DEVICE AND METHOD OF MEASURING DIRECTIVITY THEREOF

TECHNICAL FIELD

The present invention relates to a technique for using a near field measurement to measure the characteristics of an antenna on a base station side which is used in massive-MIMO proposed as a technique for making communication between a mobile terminal such as a cellular phone or a smartphone and a base station more efficient.

BACKGROUND ART

Massive-MIMO is a technique for performing multi-user MIMO transmission using a large number of antenna elements, and a plurality of configurations are devised such as a configuration in which the directivity of an antenna is digitally created by controlling these large number of antenna elements, or a configuration in which the direction of a beam is controlled using an analog phase shifter.

As a measurement of an antenna having a strong directivity such as an antenna which is used in this Massive-MIMO, a near field measurement (NFM) for calculating a far field directivity from the near electromagnetic field of an antenna on the basis of an electromagnetic field theory has been known.

In the near field measurement, since an electromagnetic field is measured in the vicinity of an antenna, there is an advantage in that a loss of electromagnetic waves due to a space is small, and that the diagnosis of an antenna can be performed from not only a directivity but also the near field distribution of the antenna.

Generally, as shown in FIG. 8, among regions of an electromagnetic field which is radiated from the aperture plane of an antenna, a region adjacent to an antenna aperture is a reactive near field region (extreme near field) mainly containing electromagnetic field components that do not contribute to radiation, and a region having no change in directivity depending on a distance from the antenna aperture is called a radiation far field region (far field). The directivity of an antenna to be generally represented refers to directivity measured in this radiation far field region.

The far field is specified as a position away by more than a distance R which satisfies the following expression with respect to a maximum diameter D (aperture dimension) of an antenna.

$$R > 2D^2/\lambda \qquad (1)$$

Here, $\lambda$ is a free space wavelength. In addition, when a gain of a transmitting antenna is set to Gt, a gain of the receiving antenna is set to Gr, and transmission power is set to be Wt, maximum power Wa capable of being received by a receiving antenna in a free space is as follows.

$$Wa = (\lambda/4\pi R)^2 \cdot Gt \cdot Gr \cdot Wt \qquad (2)$$

Therefore, in an antenna having a large aperture plane with a high gain, the distance R increases, and attenuation in a space increases. Further, in a millimeter-wave band, since a free space wavelength $\lambda$ decreases in size, there is a problem in that the amount of attenuation further increases, and that it is not likely to measure a low-level side lobe.

A radiation near field region (near field) which is a region located between the reactive near field region and the radiation far field region is a region having a change in directivity in accordance with a distance. In the NFM described above, an electromagnetic field is measured in this radiation near field region, and directivity in a far field is obtained by calculation.

Specifically, the vicinity of an antenna to which a predetermined signal is supplied is scanned by a probe antenna, and the distribution of amplitudes and phases for each scanning position is obtained from a signal received by the probe antenna, thereby allowing directivity at infinity to be obtained by data processing from this distribution. Since a measurement in the vicinity of an antenna is performed, the amount of attenuation in a space is small, and thus it is possible to perform a high-accuracy measurement as compared to a far field measurement.

The NFM is divided into a plurality of types depending on a range in which the vicinity of a test antenna is scanned, but is advantageous to an antenna having a high gain, and a plane NFM which is easy of data processing is widely used.

FIG. 9 shows a configuration of a measurement device 10 that obtains the directivity of a test antenna 1 using the plane NFM. This measurement device 10 includes a support 11 that supports the test antenna 1 in a state where its radiation plane is directed toward a predetermined direction, a probe antenna 12 for receiving electromagnetic waves which are output from the test antenna 1, and a probe scanning mechanism 13 that moves the probe antenna 12 in X and Y directions within a neighboring measurement plane facing the radiation plane of the test antenna 1.

In addition, the measurement device 10 includes a measurement control unit 24 that controls a signal generator 21 for assigning a measuring signal to the test antenna 1, an amplitude and phase detector 22 for detecting information of an amplitude and a phase from a received signal of the probe antenna 12, and a probe scanning mechanism 13, receives an output of the amplitude and phase detector 22 while scanning the position of the probe antenna 12 at a predetermined pitch within a measurement plane P, and obtains a far field directivity of the test antenna 1 from the distribution of amplitudes and phases within the measurement plane P, and a display unit 25 that displays the obtained directivity of the test antenna 1. Meanwhile, as the signal generator 21 and the amplitude and phase detector 22, a network analyzer having their functions can be used, and a personal computer can be used as the measurement control unit 24.

Here, in a case of the NFM, the probe antenna 12 scans the neighboring measurement plane P located away by approximately three wavelengths of a measurement signal from the test antenna 1, and the amplitude and phase of its electric field are detected.

The distribution of amplitudes and phases in the measurement plane P has a form of Fourier transformation of a function which is defined from the directivity of the test antenna 1 and the directivity of the probe antenna 12. In the measurement control unit 24, the function is obtained by inverse Fourier transformation, and then arithmetic processing (probe correction) of removing the directivity of the probe antenna is performed, thereby allowing the directivity of the test antenna 1 to be obtained. In the measurement control unit 24, since data processing can be performed by fast Fourier transformation (FFT), it is possible to calculate the far field directivity of the test antenna 1 at a fast rate.

It is generally known as disclosed in Non-Patent Document 1 that, as described above, the distribution of amplitudes and phase in the measurement plane P has a form of Fourier transformation of a function which is defined from the directivity of the test antenna and the directivity of the probe antenna, its function is obtained by inverse Fourier transformation, and then arithmetic processing (probe correction) of removing the directivity of the probe antenna is performed, thereby allowing the directivity of the test antenna to be obtained.

The NFM in which the directivity of the antenna is obtained in this manner has the following advantages over a far field measurement (FFM).

Since the NFM is a measurement in a short distance, a measurement can be performed even in a case where an anechoic chamber is not used, and a large-scale device is not required. In addition, since a device becomes compact in a millimeter-wave band, a measurement in a simple anechoic chamber installed in a living room can be performed, and it is possible to drastically shorten a time spent in constructing a measurement system which is a problem in a measurement in an anechoic chamber. Further, since a measurement in a region having a small free-space loss is performed, it is possible to obtain measurement results with good accuracy.

Further, in the NFM, the distribution of amplitudes and phases in the vicinity of an antenna is obtained. Therefore, in a case where directivity as designed is not obtained, the cause can be diagnosed. This is a greatly advantage to a phased array antenna such as a massive-MIMO antenna.

RELATED ART DOCUMENT

Non-Patent Document

[Non-Patent Document 1] Antenna Engineering Handbook (Second Edition), p 730 to p 733, Published on Jul. 25, 2008 of The Institute of Electronics, Information and Communication Engineers, Ohmsha, Ltd.

DISCLOSURE OF THE INVENTION

Problem that the Invention is to Solve

In the plane NFM described above, in a case where a massive-MIMO antenna is measured in reality, the next two problems to be solved are assumed.

A first problem is an increase in near field scanning range. The near field scanning range of the NFM is determined by conditions, such as the size of the test antenna and a measurement frequency, for the test antenna, and the angle range of directivity desired for measurement results.

For example, as shown in FIG. 10, when a distance to the measurement plane P is set to R, the opening of the test antenna 1 is set to D, and the desired measurement range of directivity is set to ±θc, a range Lx of electromagnetic field scanning is represented by the following expression.

$$Lx = D + 2R \tan \theta c \quad (2)$$

Here, as a practical example, FIG. 11 shows scanning ranges required for antennas AUT1 and AUT2 of 24 GHz and 60 GHz.

Each of the antennas is assumed to be a massive-MIMO antenna, and antenna elements are assumed to be lined up to be 8 columns long and 8 rows wide at an interval of λ/2. In addition, the distribution of apertures is set to be uniform, and ideal gains and the half power widths of a beam which are calculated from aperture dimensions are as shown in FIG. 11.

The theoretical directivities of the two antennas ATU1 and ATU2 are as shown in FIG. 12, and are substantially coincident with each other. The measurement distance R is set to 4λ. Here, when θc=60°, the following expressions are established.

$$AUT1: Lx = 57 + 2 \times 50 \tan 60 = 230 \text{ mm} \quad (3)$$

$$AUT2: Lx = 23 + 2 \times 20 \tan 60 = 92 \text{ mm} \quad (4)$$

From FIG. 12, it can be understood that even a third side lobe can be evaluated regarding ATU1 and ATU2. Further, when θc=80° in order to evaluate even the next side lobe, the following expressions are established, and $$AUT1: Lx = 57 + 2 \times 50 \tan 80 = 624 \text{ mm} \quad (3')$$

$$AUT2: Lx = 23 + 2 \times 20 \tan 80 = 250 \text{ mm} \quad (4')$$

it can be understood that a required scanning range increases greatly. The distance R may be reduced in order to reduce the scanning range, but multiple reflections are caused between antennas to be measured depending on the type of probe antenna. This may have an influence on measurement results, and thus it is preferable to perform a measure at a distance of approximately 3 to 5λ according to the experimental rule.

As shown in FIG. 13A, the above speculation is intended for a state where the electromagnetic wave radiation plane of the test antenna 1 directly faces the measurement plane P, and a beam (main lobe) is directed toward the center of the measurement plane P. However, as described above, in the massive-MIMO antenna, it is assumed that, in a state where the direction of the antenna is fixed, the direction of a beam of the entire antenna is changed to and used as a different direction using phase shift and power feeding for a plurality of antenna elements.

Therefore, for example, as shown in FIG. 13B, it is necessary to obtain the directivity of the antenna in a state where the direction of a beam is inclined downward. For this reason, as shown in FIG. 13B, the range of the measurement plane P has to be greatly extended.

In addition, a second problem is a decrease in the accuracy of measurement. That is, as described above, in the NFM, directivity is calculated using the FFT from a near field electric field distribution. However, in terms of the characteristics of this calculation, an interval at which the directivity of the test antenna is calculated is finest in the vicinity of the center (E-plane 0° and H-plane 0°), and the interval between the calculation points of directivity has a tendency to increase as an angle becomes larger. Therefore, as described above, in a case where a beam is not radiated to the central portion of the measurement plane in inclination to the radiation plane, and directivity is measured in a state where the width of a beam is small, there is the possibility of the accuracy of measurement deteriorating.

An object of the present invention is to solve the above problems, and to provide a massive-MIMO antenna measurement device and a method of measuring a directivity thereof which are capable of minimizing a measurement range and are capable of preventing the accuracy of measurement from deteriorating.

Means for Solving the Problem

In order to achieve the object, there is provided a massive-MIMO antenna measurement device of a first aspect of the present invention, the device including: a test antenna support portion (31) that supports a test antenna, using a massive-MIMO antenna as the test antenna; a probe antenna (12) for receiving electromagnetic waves which are output from the test antenna; a probe scanning mechanism (13) for moving the probe antenna within a predetermined measurement plane of a near field region of the test antenna; a signal generator (21) that assigns a measuring signal to the test antenna; an amplitude and phase detector (22) that detects an amplitude and a phase from a received signal of the probe antenna; and a measurement control unit (32) that controls the probe scanning mechanism, receives an output of the amplitude and phase detector while scanning a position of the probe antenna within the measurement plane, and obtains a far field directivity of the test antenna, wherein the test antenna support portion is configured such that a direction in which an electromagnetic wave radiation plane of the test antenna directly faces the measurement plane is set to a reference direction, and that a direction of the test antenna is capable of being changed from the reference direction, and the measurement control unit includes beam direction detection means (33) for causing the probe antenna to perform a scanning so as to pass through a portion of the measurement plane in a state where the test antenna is directed toward the reference direction, and obtaining the direction of a beam which is radiated by the test antenna from information of an amplitude and a phase which are obtained in the scanning, antenna direction change means (34) for controlling the test antenna support portion to change the direction of the test antenna so that the direction of a beam detected by the beam direction detection means is directed toward the center of the measurement plane, virtual directivity calculation means (35) for causing the probe antenna to perform a scanning on the measurement plane to obtain a virtual directivity of the test antenna, in a state where the direction of the test antenna is changed so that the direction of a beam is directed toward the center of the measurement plane by the antenna direction change means, and directivity correction means (36) for correcting the virtual directivity obtained in the virtual directivity calculation means by an angle changed by the antenna direction change means to obtain a directivity when the test antenna is directed toward the reference direction.

In addition, in a massive-MIMO antenna measurement device of a second aspect of the present invention according to the massive-MIMO antenna measurement device of the first aspect, the beam direction detection means obtains the direction of a beam which is radiated by the test antenna by the probe antenna performing a scanning passing through the measurement plane along one orthogonal axis thereof and a scanning passing through along the other orthogonal axis.

In addition, there is provided a method of measuring a directivity of a massive-MIMO antenna measurement device of the present invention, the device including a test antenna support portion (31) that supports a test antenna, using a massive-MIMO antenna as the test antenna, a probe antenna (12) for receiving electromagnetic waves which are output from the test antenna, a probe scanning mechanism (13) for moving the probe antenna within a predetermined measurement plane of a near field region of the test antenna, a signal generator (21) that assigns a measuring signal to the test antenna, and an amplitude and phase detector (22) that detects an amplitude and a phase from a received signal of the probe antenna, the device controlling the probe scanning mechanism, receiving an output of the amplitude and phase detector while scanning a position of the probe antenna within the measurement plane, and obtaining a far field directivity of the test antenna, the method including the steps of: configuring the test antenna support portion such that a direction in which an electromagnetic wave radiation plane of the test antenna directly faces the measurement plane is set to a reference direction, and that a direction of the test antenna is capable of being changed from the reference direction; causing the probe antenna to perform a scanning so as to pass through a portion of the measurement plane in a state where the test antenna is directed toward the reference direction, and detecting the direction of a beam which is radiated by the test antenna from information of an amplitude and a phase which are obtained the scanning; changing the direction of the test antenna by controlling the test antenna support portion so that the detected direction of a beam is directed toward the center of the measurement plane; causing the probe antenna to perform a scanning on the measurement plane in a state where the direction of the test antenna is changed so that the beam direction is directed toward the center of the measurement plane, and obtaining a virtual directivity of the test antenna; and correcting the obtained virtual directivity by an angle by which the direction of the test antenna is changed, and obtaining a directivity when the test antenna is directed toward the reference direction.

Advantage of the Invention

As described above, in the present invention, the probe antenna is caused to perform a scanning to detect the direction of a beam which is radiated by the test antenna in a state where the test antenna is directed toward the reference direction, the direction of the test antenna is changed so that the detected direction of a beam is directed toward the center of the measurement plane, the probe antenna is then caused to perform a scanning on the measurement plane to obtain the virtual directivity of the test antenna, and the obtained virtual directivity is corrected by an angle by which the direction of the test antenna is changed to obtain a directivity when the test antenna is directed toward the reference direction.

Therefore, even in a case where the beam direction of the test antenna which is directed toward the reference direction is away from the center of the measurement plane, it is possible to obtain a directivity in a measurement plane having a minimum size.

In addition, since the directivity is obtained after the direction of the test antenna is changed so that the beam of the test antenna is directed toward the center of the measurement plane in which directivity calculation results are obtained with a high degree of accuracy, and the amount of change in the direction of the antenna is corrected, it is possible to obtain a high-accuracy directivity regardless of the beam direction.

BEST MODE FOR CARRYING OUT THE INVENTION

Hereinafter, an embodiment of the present invention will be described with reference to the accompanying drawings.

Figure 1:
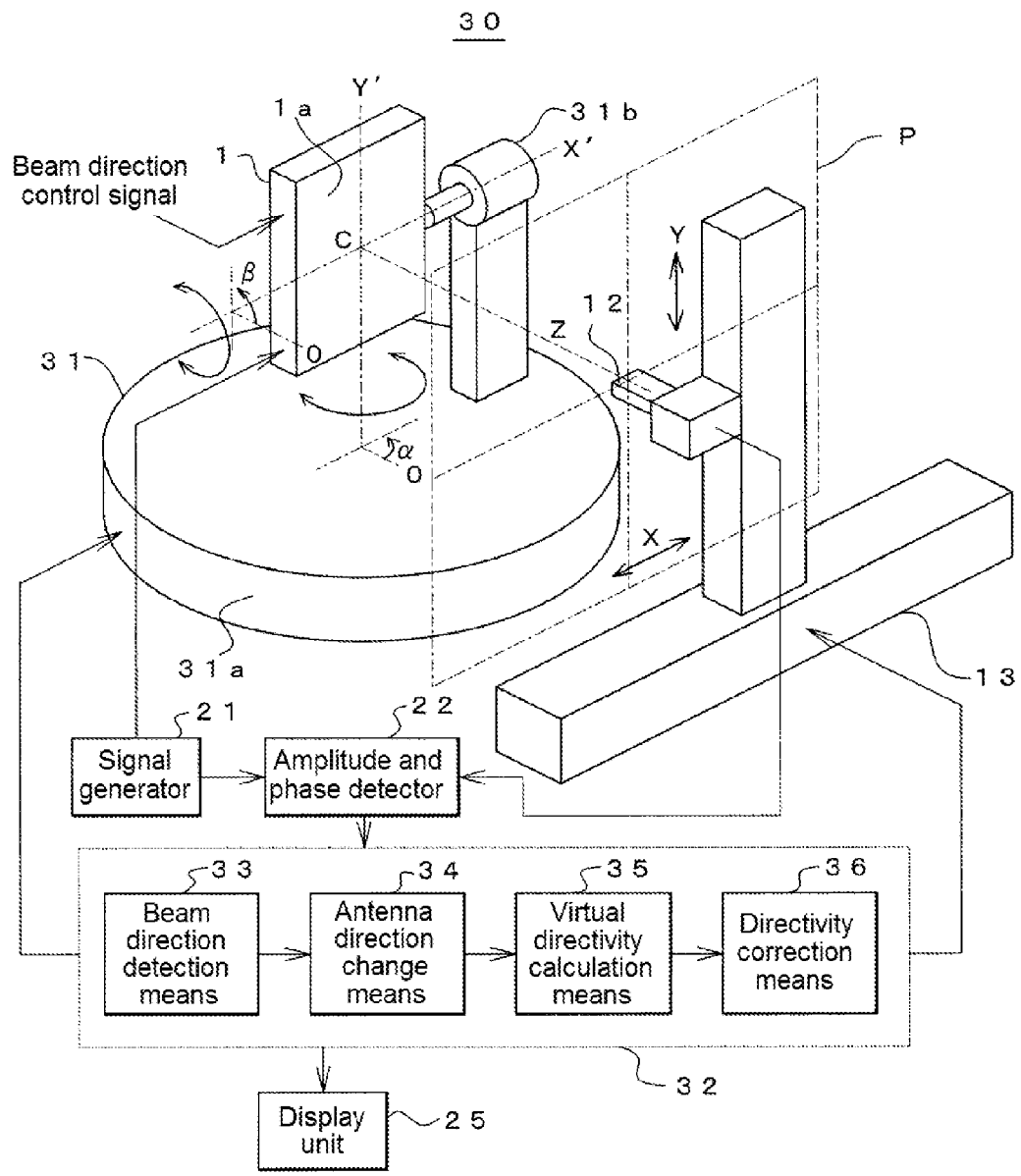
FIG. 1 is a configuration diagram of an embodiment of the present invention.

FIG. 1 shows a configuration of a massive-MIMO antenna measurement device (hereinafter, simply referred to as a measurement device) 30 to which the present invention is applied.

This measurement device 30 includes a test antenna support portion 31 and a measurement control unit 32, in addition to the probe antenna 12, the probe scanning mechanism 13, the signal generator 21, the amplitude and phase detector 22, and the display unit 25 which are described in the aforementioned device 10 of the related art.

This measurement device 30 is a device that measures the directivity of the test antenna 1 which is used as a massive-MIMO antenna, and is configured herein such that the test antenna 1 is used as a planar array antenna having a plurality of antenna elements arranged lengthwise and crosswise, a power feeding phase for each antenna element is controlled by a beam direction control signal which is input from the outside, and that the direction of a beam which is output in the entire antenna is changed.

The test antenna support portion 31 supports the test antenna 1 so that a direction in which its electromagnetic wave radiation plane 1a (aperture plane of an antenna) directly faces a measurement plane P is set to a reference direction, and that the electromagnetic wave radiation plane 1a can change to a state of being inclined with respect to the measurement plane P from the reference direction. Meanwhile, the reference direction herein refers to a state where the electromagnetic wave radiation plane 1a of the test antenna 1 faces the measurement plane P in parallel, and a Z-axis which is orthogonal to an X-axis and a Y-axis at the origin position of the measurement plane P passes through a central position C of the electromagnetic wave radiation plane 1a.

For example, as shown in FIG. 1, the test antenna support portion 31 includes an azimuth change mechanism portion 31a that rotates around a Y'-axis passing through the central position C of the electromagnetic wave radiation plane 1a of the test antenna 1 in parallel to the Y-axis of the measurement plane P, and an elevation angle change mechanism portion 31b, fixed onto the azimuth change mechanism portion 31a, which supports the test antenna 1 on the rotational axis of the azimuth change mechanism portion 31a and rotates the test antenna 1 around an X'-axis passing through the central position C of the electromagnetic wave radiation plane 1a of the test antenna 1 in parallel to the X-axis of the measurement plane P. The azimuth angle of 0° (reference angle) of the test antenna 1 based on the azimuth change mechanism portion 31a is a direction parallel to the Z-axis, and the azimuth angle can be changed to any angle α around the Y'-axis on the basis of this direction. Similarly, the elevation angle of 0° (reference angle) of the test antenna 1 based on the elevation angle change mechanism portion 31b is also a direction parallel to the Z-axis, and the elevation angle can be changed to any angle β around the X'-axis on the basis of this direction.

As described above, the probe antenna 12 is used for receiving electromagnetic waves which are output from the test antenna 1, and has a rectangular waveguide or the like used therein in a band of several tens of GHz.

Main characteristics obtained in the probe antenna 12 that performs a near field scanning are the next three of (a) to (c).

(a) To have as large a beam width as possible. Ideally, an isotropic antenna is suitable, but directivity is present in an actual antenna. For this reason, there is a need for probe correction of correcting the directivity of the test antenna 1 calculated by NFM in the directivity of the probe antenna. In a case where an antenna having a small beam width is used as the probe antenna, the dynamic range of directivity decreases, and thus there is the possibility of a low-level side lobe not being capable of being accurately measured.

(b) A small cross polarization. The directivity of an antenna is required to be evaluated for each polarization. The evaluation is performed base on vertical and horizontal polarizations in a case of a linear polarization antenna, and based on left-handed polarization and right-handed polarization in a case of a circular polarization antenna. Since the polarization in NFM is dependent on the polarization of the probe antenna, it is necessary to use a probe antenna having as small a cross polarization as possible in order to perform measurement with good accuracy.

(c) A small influence of multiple reflections on measurement results. This can be realized by reducing the size of an antenna, and covering the periphery thereof with a radio wave absorber. Meanwhile, in order to reduce the influence of reflection, it is also possible to use an optical probe using optical electric field conversion.

Here, a waveguide of which the tip is opened is used as the probe antenna satisfying the above conditions in a millimeter-wave band. Since the probe antenna 12 using this waveguide has a small antenna aperture plane, a beam is wide, and the cross polarization can be suppressed to approximately −20 dB with respect to main polarization. Further, a structure of which the periphery is covered with a radio wave absorber can be simply implemented, and thus it is easy to take a countermeasure for multiple reflections.

Meanwhile, although not shown in FIG. 1, the countermeasure for multiple reflections is taken on the probe antenna 12 of the embodiment, and the test antenna support portion 31, the surface of the probe scanning mechanism 13, and a space between the test antenna 1 and the probe antenna 12, except the probe antenna 12, are covered with a radio wave absorber (simple anechoic chamber), which leads to preventing the influence of internal unnecessary reflection or mixing of electromagnetic waves from the outside, in a small-scale measurement environment.

The probe scanning mechanism 13 moves the probe antenna 12 in X and Y direction at a predetermined pitch within the measurement plane P. The probe scanning mechanism 13 and the test antenna support portion 31 are controlled by the measurement control unit 32.

The signal generator 21 assigns a measuring signal to the test antenna 1, and the amplitude and phase detector 22 receives a received signal of the probe antenna 12, detects information of the amplitude and phase for each position of the probe antenna 12, and outputs the information to the measurement control unit 32. Meanwhile, the signal generator 21 and the amplitude and phase detector 22 may be constituted by network analyzers or the like having their functions.

Similarly to the aforementioned measurement device 10 of the related art, the measurement control unit 32 is constituted by a personal computer or the like, and basically performs a process of controlling the probe scanning mechanism 13 to thereby receive an output of the amplitude and phase detector 22 while scanning the position of the probe antenna 12 at a predetermined pitch within the measurement plane P and to obtain the far field directivity of the test antenna 1 from the distribution of amplitude phases within the measurement plane, but herein has a configuration for coping with the beam direction of the test antenna 1 used as a massive-MIMO antenna being changed not only in a direction orthogonal to the electromagnetic wave radiation plane but also in a wide angle range, by phase shift and power feeding control or the like for each antenna element.

Figure 2:
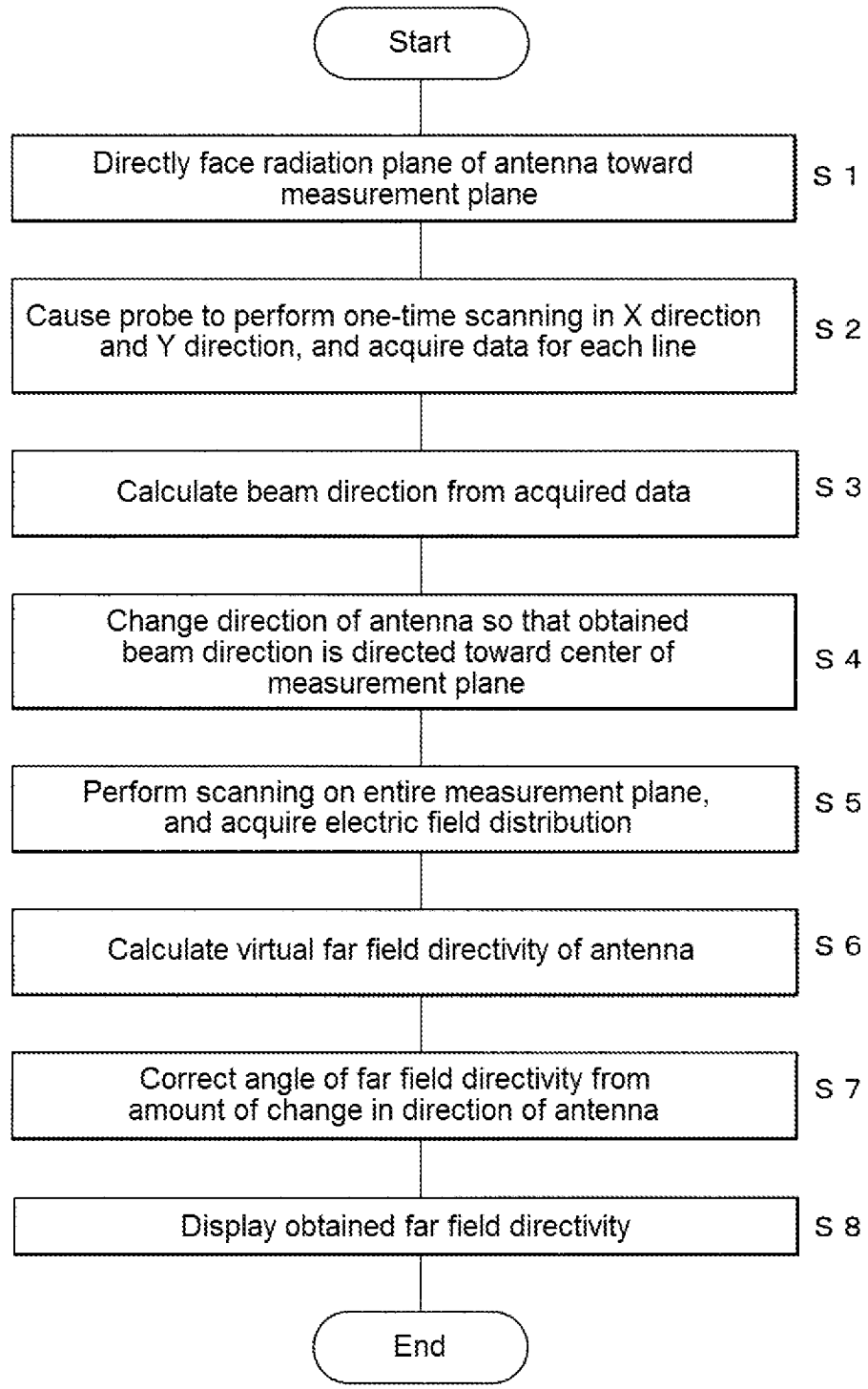
FIG. 2 is a flow diagram illustrating a processing procedure of main parts of the embodiment of the present invention.

That is, the measurement control unit 32 controls the probe scanning mechanism 13 and the test antenna support portion 31 in terms of its function, includes beam direction detection means 33, antenna direction change means 34, virtual directivity calculation means 35, and directivity correction means 36 in addition to an interface (not shown) for receiving the output of the amplitude and phase detector 22, and performs a process in accordance with a flow diagram shown in FIG. 2. Hereinafter, the function and processing procedure of the measurement control unit 32 will be described in detail.

The beam direction detection means 33 performs a scanning so that the probe antenna 12 passes through a portion of the measurement plane P (S2) in a state where the electromagnetic wave radiation plane 1a of the test antenna 1 is directed toward the reference direction (S1), and obtains the direction of a beam (main lobe) radiated by the test antenna 1 from information of an amplitude and a phase which are obtained in the scanning (S3). In such a beam direction detection process, in the same manner as a normal directivity calculation process, the function is obtained by an inverse Fourier transformation and a far field directivity is obtained. However, since strict directivity is not required, probe correction can be omitted.

Such beam direction detection is for roughly detecting the direction of a beam which is radiated by the test antenna 1 in reality. The detection may be performed in a direction along the X-axis one time and in a direction along the Y-axis one time, as a minimum scanning, without requiring scanning the entire measurement plane.

Figure 3:
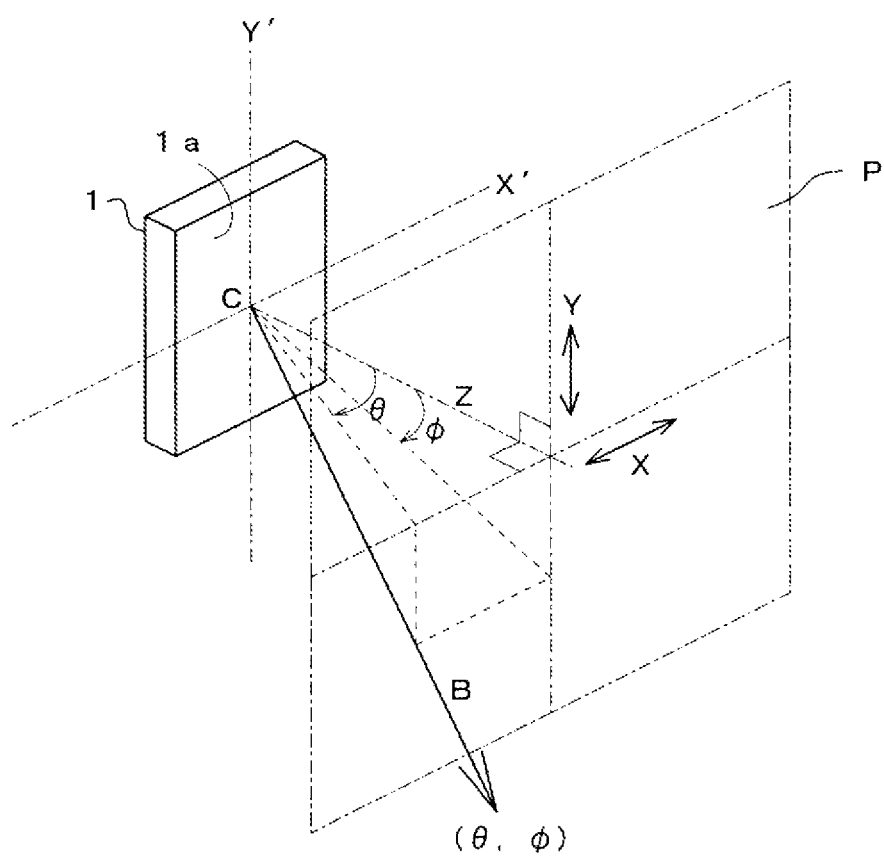
FIG. 3 is a diagram illustrating operations of the embodiment of the present invention.
Figure 4A:
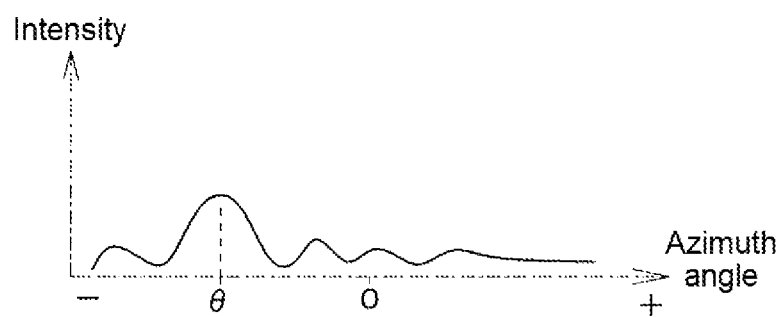
FIGS. 4A and 4B are diagrams illustrating operations of the embodiment of the present invention.
Figure 4B:
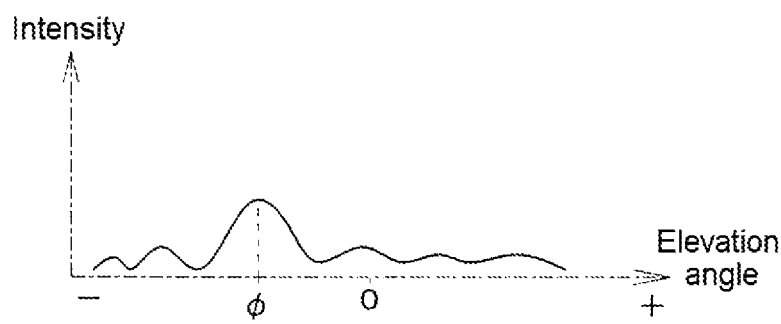

For example, as shown in FIG. 3, when the above arithmetic processing is performed in a state where a beam B is radiated at a certain angle from the test antenna 1 directly facing the measurement plane P, it is assumed that the directivity of a horizontal plane (H-plane) is set to have a maximum intensity at an azimuth angle θ as shown in FIG. 4A, and that the directivity of a vertical plane (E-plane) is set to have a maximum intensity at an elevation angle φ as shown in FIG. 4B. Meanwhile, in a case where it is easy to specify positions (boundary between the main lobe and the side lobe) having a minimum amplitude on both sides of positions having a maximum amplitude rather than these positions, an intermediate value between two minimum positions on both sides of the maximum positions may be obtained as an angle for specifying the direction of a beam.

In this manner, in a case where the direction of a beam passes through a position far away from the center of the measurement plane P, the size of the measurement plane P is not enough when the directivity is obtained inclusive of an approximately three-order side lobe. In addition, even in a case where the probe antenna 12 is caused to perform a fine scanning and its directivity is obtained in this state, the accuracy of measurement in the vicinity of the main lobe decreases in terms of the property of directivity calculation based on its FFT. For this reason, in this measurement device 30, the test antenna support portion 31 is controlled to change the direction of the test antenna 1 from the direction of a beam obtained as described above so that the direction of a beam is in the vicinity of 0° (state of passing through the vicinity of the center of the measurement plane P) in both the horizontal plane and vertical planes (S4). Meanwhile, here, it is determined whether the detected direction of a beam is in the vicinity of the center of the measurement plane P. The probe antenna 12 may be caused to perform a scanning throughout the entire measurement plane to calculate its directivity, as in the related art, in a case where the direction is in the vicinity thereof, and the process may proceed to the next antenna direction change process in a case where the direction is not in the vicinity thereof (S4).

Figure 5:
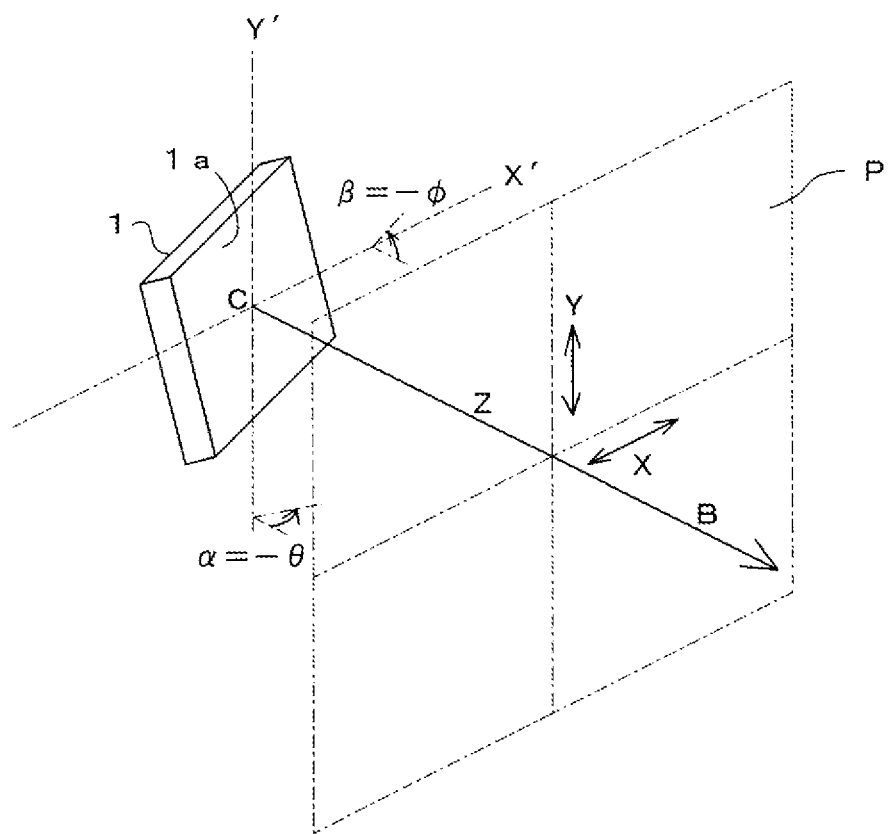
FIG. 5 is a diagram illustrating operations of the embodiment of the present invention.

Here, as shown in FIG. 5, when the test antenna 1 is rotated from α=0 to α=−θ around the Y'-axis by the azimuth change mechanism portion 31a and is rotated from β=0 to β=−φ by the elevation angle change mechanism portion 31b around the X'-axis, with respect to the azimuth angle θ and the elevation angle φ of the beam B of the test antenna 1 which are detected, the azimuth angle and the elevation angle in the far field of the beam B radiated from the electromagnetic wave radiation plane 1a of the test antenna 1 can be set to approximately 0° (state of passing through the vicinity of the center of the measurement plane P).

In this manner, when the direction of a beam is changed so as to be directed toward the center of the measurement plane P, the probe scanning mechanism 13 is controlled by the virtual directivity calculation means 35, and the probe antenna 12 scans the entire measurement plane at a predetermined pitch. Thereby, information of the amplitude and phase of an electric field at each scanning position is obtained, and the virtual directivity of the far field of the test antenna 1 is calculated from the distribution thereof (S5 and S6).

Such an arithmetic operation is described in Non-Patent Document 1 stated above, and thus the detailed description thereof is not given. To explain it briefly, since the receiving output of the probe antenna 12 is expressed by Fourier transformation of a coupling product which is equal to an inner product of a vector transmission function of the test antenna 1 and a vector receiving function of the probe antenna 12, the distribution of amplitudes and phases is obtained by measuring the probe receiving output at each scanning position on the measurement plane P, and a coupling product is obtained by performing inverse Fourier transformation on this distribution. The influence of the directivity of the probe antenna 12 is removed (probe correction) by dividing the coupling product into the vector receiving function obtained from the directivity (which is known) of the probe antenna 12, the vector transmission function of the test antenna 1 is obtained, and the directivity is calculated by predetermined arithmetic operations (for example, Expressions 11-70 and 11-71 of Non-Patent Document 1) on the basis of the vector transmission function.

Meanwhile, a sampling interval (movement interval of the probe antenna 12) in the near field scanning has an influence on an angle range which is obtained when being converted into a far field, and thus it is known that an angle range decreases to be obtained when the sampling interval is made larger, and that the angle range increases when the sampling interval is made smaller. However, since directivity in a case of the plane NFM refers to only data of a range of ±90° in principle, a sampling interval having an angle range of ±90° is not required to be set to be equal to or less than λ/2. However, the sampling interval is normally set to be approximately 0.45λ in many cases, due to a problem of data processing. In addition, in a case where measurement up to a specific angle range in a front direction may be performed, it is also considered that the speedup of measurement is achieved by making the sampling interval larger (making the number of measurement points smaller).

Figure 6A:
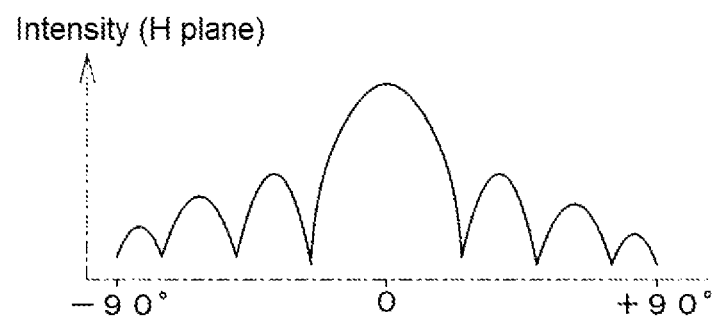
FIGS. 6A and 6B are diagrams illustrating operations of the embodiment of the present invention.
Figure 6B:
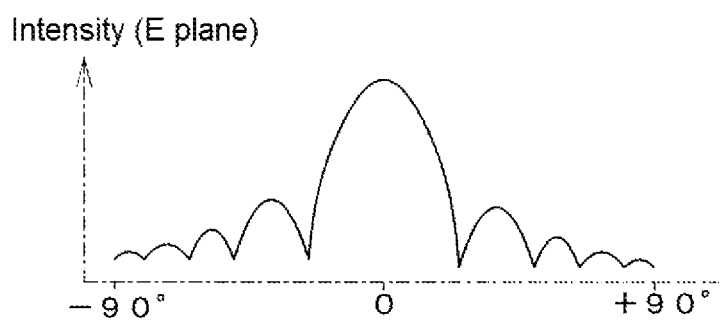

FIGS. 6A and 6B show examples of the directivities of the horizontal plane (H-plane) and the vertical plane (E-plane) which are obtained in the arithmetic processing. The directivities obtained herein are measured by changing the direction of the antenna so that the beam direction of the test antenna 1 is directed toward the center of the measurement plane, and thus the directivities when the direction of the test antenna 1 directly faces the measurement plane are not correctly indicated.

In order to solve this, the directivity correction means 36 corrects data of the virtual directivity obtained in the virtual directivity calculation means 35 so as to be restored by angles (−θ and −φ) changed by the antenna direction change means 34, and obtains far field directivity when the direction of the test antenna 1 is directed toward the reference direction (S7).

Figure 7A:
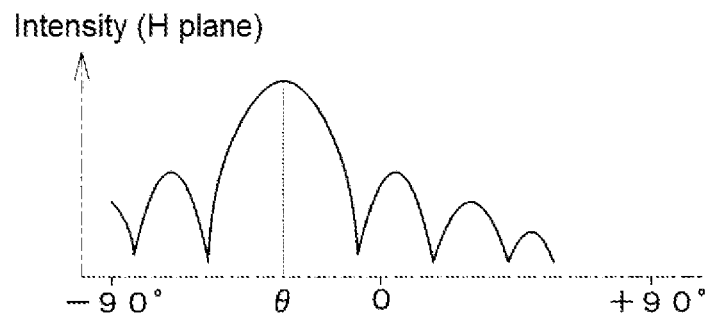
FIGS. 7A and 7B are diagrams illustrating operations of the embodiment of the present invention.
Figure 7B:
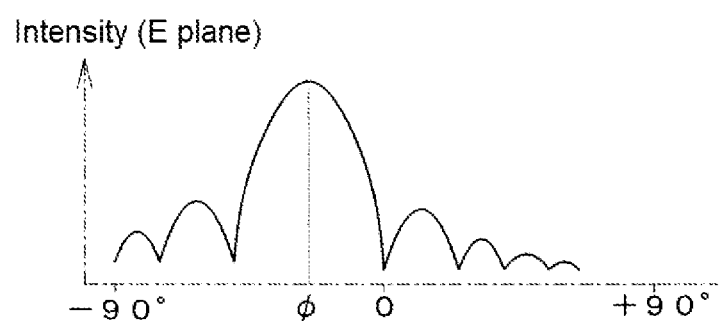
Figure 8:
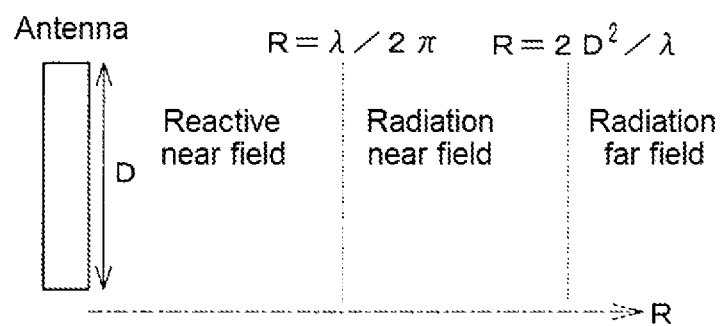
FIG. 8 is a diagram illustrating a measurement region of an antenna.
Figure 9:
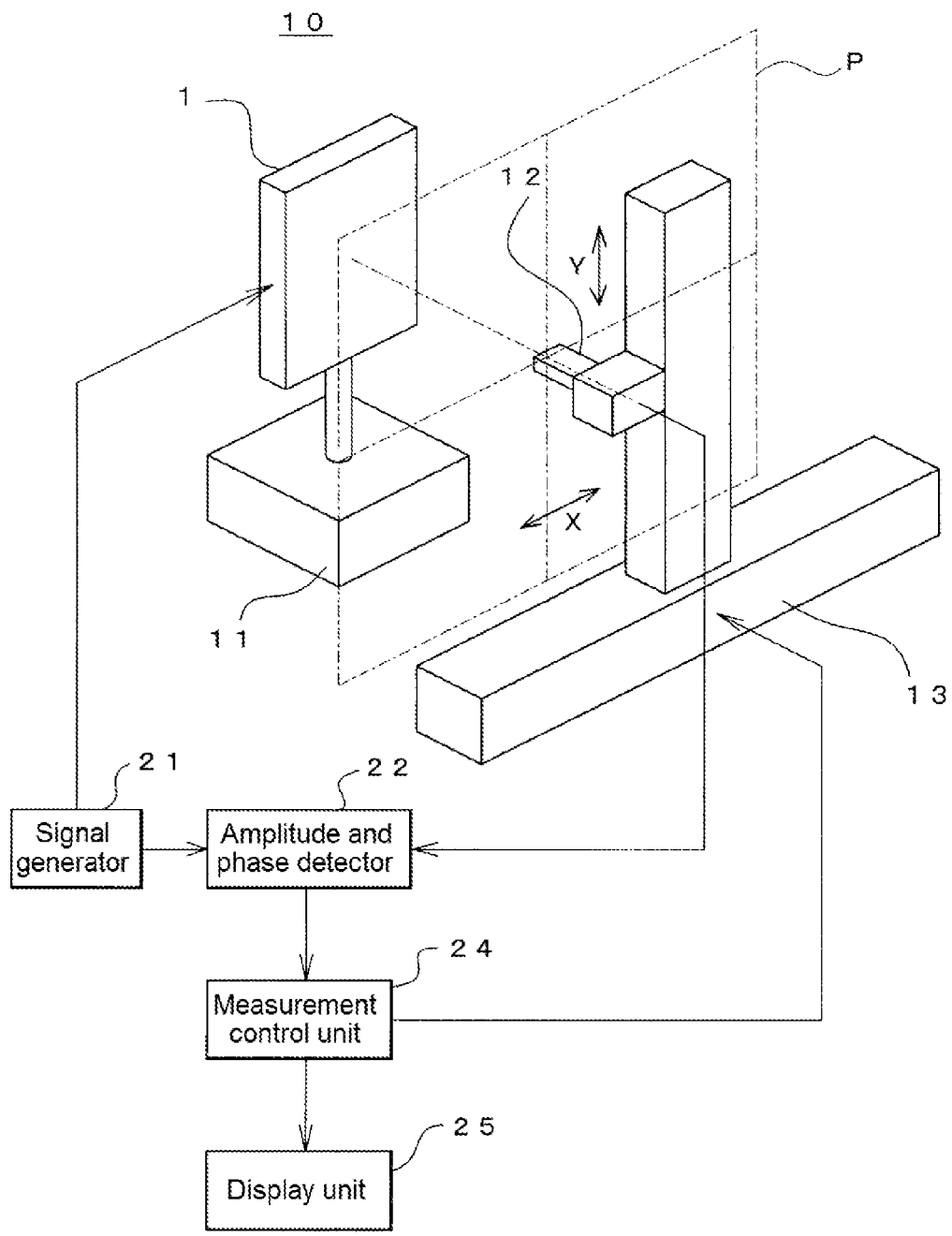
FIG. 9 is a configuration diagram of a device of the related art.
Figures 10, 11:
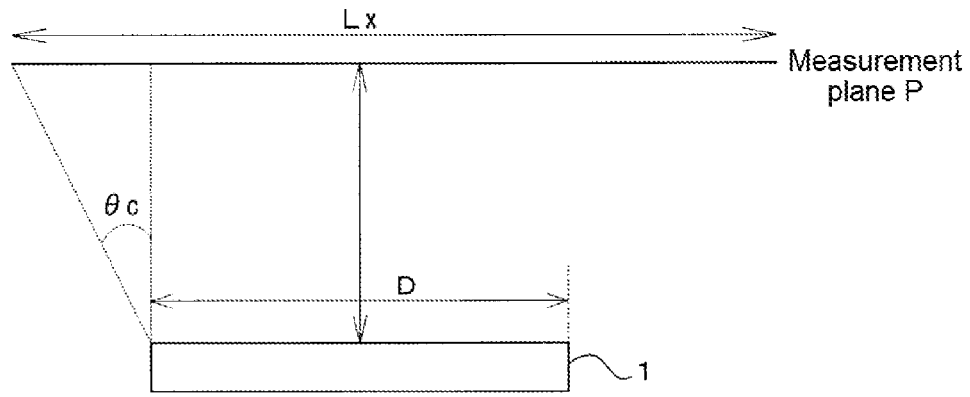
FIG. 10 is a diagram illustrating a relationship between the directivity of an antenna and a measurement range.
FIG. 11 is a diagram illustrating parameters of two antennas used for obtaining a measurement range.
Figure 12:
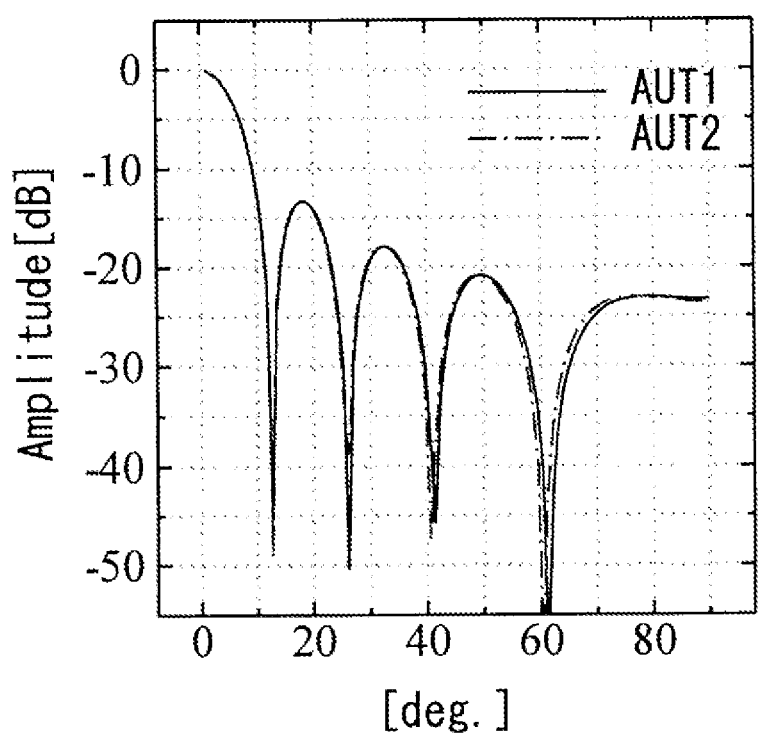
FIG. 12 is a diagram illustrating the directivities of two antennas.
Figures 13A, 13B:
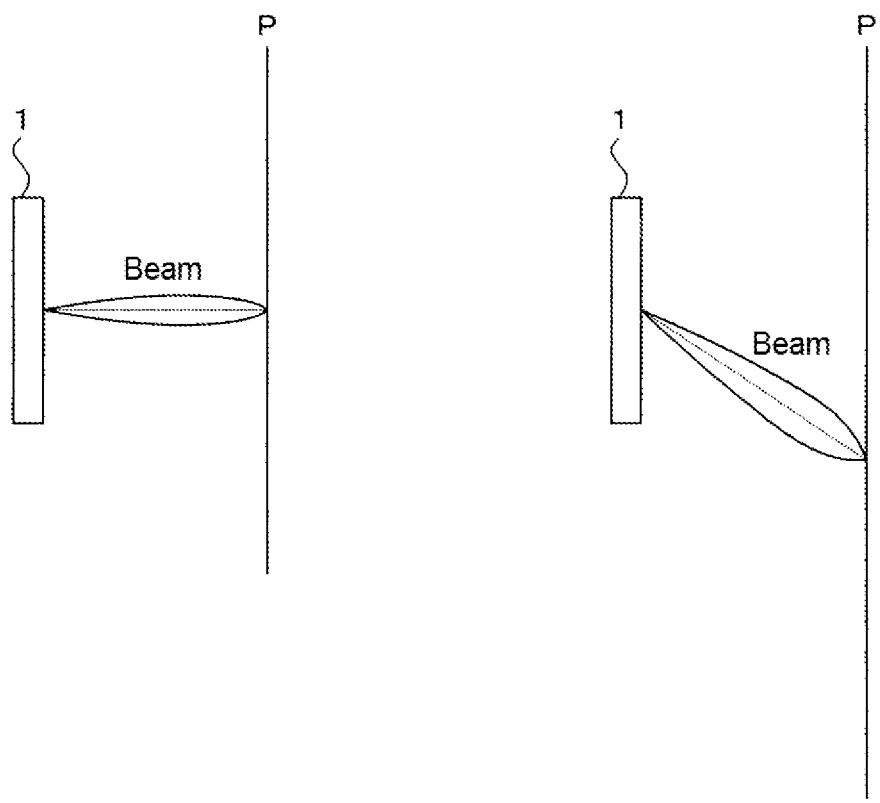
FIGS. 13A and 13B are diagrams illustrating a relationship between the beam direction of an antenna and a measurement range.

FIGS. 7A and 7B show examples of the directivities of the horizontal plane (H-plane) and the vertical plane (E-plane) which are corrected by the directivity correction means 36. The directivity of the horizontal plane (H-plane) shifts by θ, and the directivity of the vertical plane (E-plane) shifts by φ, with respect to the directivities shown in FIGS. 6A and 6B.

The directivities obtained in this manner are displayed by the display unit 25, and thus it is possible to ascertain the directivity of the test antenna 1 having the beam direction thereof changed variously while using a measurement plane having a restricted size (S8).

In addition, as described above, in a case where the near field directivity is calculated by FFT, an interval at which the directivity of the test antenna 1 is calculated is finest in the vicinity of the center (E-plane 0°, H-plane 0°) of the measurement plane, and the interval of the calculation point of directivity has a tendency to increase as an angle becomes larger. However, in this measurement device 30, the direction itself of the antenna is changed so that the beam direction of the test antenna 1 expected to be switched to various directions is directed toward the center of the measurement plane, and then the directivity is calculated. Therefore, it is possible to obtain a directivity in the vicinity of the main lobe with a much higher degree of accuracy than in a case of obtaining directivity in a state where the beam direction is not directed toward the center of the measurement plane.

In the above description, on the assumption of a case where the beam direction of the test antenna 1 directed toward the reference direction on the measurement device 30 side is unknown, the direction of a beam in the far field is specified by causing the probe antenna 12 to scan the X-axis (straight line of Y=0) of the measurement plane one time and to scan the Y-axis (straight line of X=0) one time in the beam direction detection means 33. This is to make a measurement efficient as a minimum scanning for specifying the direction of a beam. However, in a case where the azimuth angle and the elevation angle of a far field beam which are calculated on the basis of the information obtained by the one-time scanning of X and Y are far away from a predetermined angle range centering on 0°, at least one scanning in the X direction and the Y direction is performed again so that the beam direction passes through the vicinity of coordinates intersecting the measurement plane, and thus it is possible to obtain the beam direction in a far field more accurately.

In this case, in a case where at least one magnitude (absolute value) of the far field beam directions (θ and φ) obtained in a first scanning exceeds a predetermined threshold γ, a scanning passing through coordinates at which the beam direction exceeding the threshold γ and the measurement plane intersect each other may be added at least one time.

In addition, in a case where the beam direction in the far field of the test antenna 1 which is directed toward the reference direction can be predicted on the measurement device 30 side, the beam direction detection means 33 obtains approximate coordinates (X, Y)=(A, B) at which the predicted beam direction intersects the measurement plane, causes the probe antenna 12 to scan the measurement plane one time on the straight line of Y=B parallel to the X-axis, and causes the probe antenna 12 to scan the measurement plane one time on the straight line of X=A parallel to the Y-axis. The probe antenna 12 is caused to perform a scanning so as to pass through the coordinates at which the direction of a beam in the far field is expected to intersect the measurement plane in this manner, and thus the accuracy of detection of an amplitude and a phase becomes higher, thereby allowing the direction of a beam in an actual far field to be obtained more accurately.

In addition, in a case where a difference between the direction of a beam in the far field obtained in the beam direction detection means 33 and the direction of a far field beam (for example, direction of a beam predicted from the beam direction control signal) predicted in advance is obtained and stored, the difference can be used in data correction for phase shift control of a base station device or the like using the test antenna 1.

DESCRIPTION OF REFERENCE NUMERALS AND SIGNS

1: test antenna, 13: probe scanning mechanism, 21: signal generator, 22: amplitude and phase detector, 25: display unit, 30: measurement device, 31: test antenna support portion, 32: measurement control unit, 33: beam direction detection means, 34: antenna direction change means, 35: virtual directivity calculation means, 36: directivity correction means

What is claimed is:
1. A massive-MIMO (multiple-input multiple-output) antenna measurement device comprising:
   a test antenna support portion that supports a test antenna, using a massive-MIMO antenna as the test antenna;
   a probe antenna for receiving electromagnetic waves which are output from the test antenna;
   a probe scanning mechanism for moving the probe antenna within a predetermined measurement plane of a near field region of the test antenna;
   a signal generator that assigns a measuring signal to the test antenna;
   an amplitude and phase detector that detects an amplitude and a phase from a received signal of the probe antenna; and
   a measurement control unit that controls the probe scanning mechanism, receives an output of the amplitude and phase detector while scanning a position of the probe antenna within the measurement plane, and obtains a far field directivity of the test antenna, wherein the test antenna support portion is configured such that a direction in which an electromagnetic wave radiation plane of the test antenna directly faces the measurement plane is set to a reference direction, and that a direction of the test antenna is capable of being changed from the reference direction, and antenna direction change means for controlling the test antenna support portion to change the direction of the test antenna is included so that a direction of a beam which is radiated by the test antenna is directed toward a center of the measurement plane.

2. The massive-MIMO antenna measurement device according to claim 1, wherein the measurement control unit further includes beam direction detection means, virtual directivity calculation means, and directivity correction means, the beam direction detection means causes the probe antenna to perform a scanning so as to pass through a portion of the measurement plane in a state where the test antenna is directed toward the reference direction, and obtains the direction of a beam which is radiated by the test antenna from information of an amplitude and a phase which are obtained in the scanning, the antenna direction change means controls the test antenna support portion to change the direction of the test antenna so that the direction of a beam detected by the beam direction detection means is directed toward the center of the measurement plane, the virtual directivity calculation means causes the probe antenna to perform a scanning on the measurement plane to obtain a virtual directivity of the test antenna, in a state where the direction of the test antenna is changed so that the direction of a beam is directed toward the center of the measurement plane by the antenna direction change means, and the directivity correction means corrects the virtual directivity obtained in the virtual directivity calculation means by an angle changed by the antenna direction change means to obtain a directivity when the test antenna is directed toward the reference direction.

3. The massive-MIMO antenna measurement device according to claim 2, wherein the beam direction detection means obtains the direction of a beam which is radiated by the test antenna by the probe antenna performing a scanning passing through the measurement plane along one orthogonal axis thereof and a scanning passing through along the other orthogonal axis.

4. The massive-MIMO antenna measurement device according to claim 2, wherein the angle of the direction of a beam which is obtained in the beam direction detection means is an intermediate value between two minimum positions on both sides of maximum positions having a largest directivity.

5. The massive-MIMO antenna measurement device according to claim 3, wherein the angle of the direction of a beam which is obtained in the beam direction detection means is an intermediate value between two minimum positions on both sides of maximum positions having a largest directivity.

6. The massive-MIMO antenna measurement device according to claim 2, wherein it is determined whether the direction of a beam, radiated by the test antenna, which is changed by the antenna direction change means is in the vicinity of the center of the measurement plane, progress is made to the virtual directivity calculation means in a case where the direction is in the vicinity of the center, and progress is made to the antenna direction change means again in a case where the direction is not in the vicinity of the center.

7. The massive-MIMO antenna measurement device according to claim 3, wherein it is determined whether the direction of a beam, radiated by the test antenna, which is changed by the antenna direction change means is in the vicinity of the center of the measurement plane, progress is made to the virtual directivity calculation means in a case where the direction is in the vicinity of the center, and progress is made to the antenna direction change means again in a case where the direction is not in the vicinity of the center.

8. The massive-MIMO antenna measurement device according to claim 2, wherein in a case where beam directions ($\theta$ and $\varphi$) obtained in the beam direction detection means exceed a predetermined threshold, a scanning passing through coordinates at which the beam direction exceeding the threshold and the measurement plane intersect each other is added at least one time.

9. The massive-MIMO antenna measurement device according to claim 3, wherein in a case where beam directions ($\theta$ and $\varphi$) obtained in the beam direction detection means exceed a predetermined threshold, a scanning passing through coordinates at which the beam direction exceeding the threshold and the measurement plane intersect each other is added at least one time.

10. The massive-MIMO antenna measurement device according to claim 2, wherein in a case where the beam direction of the test antenna which is directed toward the reference direction is able to be predicted by a beam direction control signal which is input from an outside, the beam direction detection means previously obtains coordinates $(X, Y)=(A, B)$ at which the predicted beam direction intersects the measurement plane, causes the probe antenna to scan the measurement plane one time on a straight line of $Y=B$ parallel to an X-axis, causes the probe antenna to scan the measurement plane one time on a straight line of $X=A$ parallel to a Y-axis, and obtains the beam direction in a far field more accurately.

11. The massive-MIMO antenna measurement device according to claim 3, wherein in a case where the beam direction of the test antenna which is directed toward the reference direction is able to be predicted by a beam direction control signal which is input from an outside, the beam direction detection means previously obtains coordinates $(X, Y)=(A, B)$ at which the predicted beam direction intersects the measurement plane, causes the probe antenna to scan the measurement plane one time on a straight line of $Y=B$ parallel to an X-axis, causes the probe antenna to scan the measurement plane one time on a straight line of $X=A$ parallel to a Y-axis, and obtains the beam direction in a far field more accurately.

12. The massive-MIMO antenna measurement device according to claim 1, wherein the probe antenna is a waveguide of which a tip is opened, and has a structure in which its periphery is covered with a radio wave absorber.

13. The massive-MIMO antenna measurement device according to claim 2, wherein the probe antenna is a waveguide of which a tip is opened, and has a structure in which its periphery is covered with a radio wave absorber.

14. The massive-MIMO antenna measurement device according to claim 3, wherein the probe antenna is a waveguide of which a tip is opened, and has a structure in which its periphery is covered with a radio wave absorber.

15. The massive-MIMO antenna measurement device according to claim 1, wherein the test antenna support portion includes an elevation angle change mechanism portion, fixed onto an azimuth change mechanism portion, which supports the test antenna on a rotational axis of the azimuth change mechanism portion and rotates the test antenna around an axis passing through a central position of the electromagnetic wave radiation plane of the test antenna in parallel to an axis of the measurement plane.

16. The massive-MIMO antenna measurement device according to claim 2, wherein the test antenna support portion includes an elevation angle change mechanism portion, fixed onto an azimuth change mechanism portion, which supports the test antenna on a rotational axis of the azimuth change mechanism portion and rotates the test antenna around an axis passing through a central position of the electromagnetic wave radiation plane of the test antenna in parallel to an axis of the measurement plane.

17. The massive-MIMO antenna measurement device according to claim 3, wherein the test antenna support portion includes an elevation angle change mechanism portion, fixed onto an azimuth change mechanism portion, which supports the test antenna on a rotational axis of the azimuth change mechanism portion and rotates the test antenna around an axis passing through a central position of the electromagnetic wave radiation plane of the test antenna in parallel to an axis of the measurement plane.

18. A method of measuring a directivity of a massive-MIMO (multiple-input multiple-output) antenna measurement device including
 a test antenna support portion that supports a test antenna, using a massive-MIMO antenna as the test antenna,
 a probe antenna for receiving electromagnetic waves which are output from the test antenna,
 a probe scanning mechanism for moving the probe antenna within a predetermined measurement plane of a near field region of the test antenna,
 a signal generator that assigns a measuring signal to the test antenna, and
 an amplitude and phase detector that detects an amplitude and a phase from a received signal of the probe antenna,
 the device controlling the probe scanning mechanism, receiving an output of the amplitude and phase detector while scanning a position of the probe antenna within the measurement plane, and obtaining a far field directivity of the test antenna, the method comprising the steps of:

configuring the test antenna support portion such that a direction in which an electromagnetic wave radiation plane of the test antenna directly faces the measurement plane is set to a reference direction, and that a direction of the test antenna is capable of being changed from the reference direction; and
 changing the direction of the test antenna by controlling the test antenna support portion so that a direction of a beam which is radiated by the test antenna is directed toward a center of the measurement plane.

19. The method of measuring a directivity of a massive-MIMO antenna measurement device according to claim 18, further comprising a step of causing the probe antenna to perform a scanning so as to pass through a portion of the measurement plane in a state where the test antenna is directed toward the reference direction, and detecting the direction of a beam which is radiated by the test antenna from information of an amplitude and a phase which are obtained the scanning,
 wherein the step of changing the direction of the test antenna includes the steps of
 changing the direction of the test antenna by controlling the test antenna support portion so that the detected direction of a beam is directed toward the center of the measurement plane,
 causing the probe antenna to perform a scanning on the measurement plane in a state where the direction of the test antenna is changed so that the beam direction is directed toward the center of the measurement plane, and obtaining a virtual directivity of the test antenna, and
 correcting the obtained virtual directivity by an angle by which the direction of the test antenna is changed, and obtaining a directivity when the test antenna is directed toward the reference direction.

20. The massive-MIMO antenna measurement device according to claim 19, wherein the step of detecting the direction of a beam which is radiated by the test antenna includes obtaining the direction of a beam which is radiated by the test antenna by the probe antenna performing a scanning passing through the measurement plane along one orthogonal axis.

* * * * *